United States Patent [19]
Parab et al.

[11] Patent Number: 5,846,374
[45] Date of Patent: Dec. 8, 1998

[54] GAS AGITATED LIQUID ETCHER

[75] Inventors: Sameer Parab; Mark A. Salsbery, both of San Jose, Calif.

[73] Assignee: Elantec Semiconductor, Inc., Milpitas, Calif.

[21] Appl. No.: 724,848

[22] Filed: Oct. 3, 1996

[51] Int. Cl.$^6$ ................................................ H01L 21/00
[52] U.S. Cl. ........................... 156/345; 216/90; 438/747
[58] Field of Search .......................... 156/345 L; 216/90, 216/83; 438/747, 745

[56] References Cited

U.S. PATENT DOCUMENTS

| | | | |
|---|---|---|---|
| 4,251,317 | 2/1981 | Foote | 156/345 X |
| 4,302,273 | 11/1981 | Howard | 156/345 |
| 4,675,067 | 6/1987 | Valley | 216/90 X |
| 4,840,701 | 6/1989 | Stern | 438/747 |

OTHER PUBLICATIONS

Chapter Nine, "Agitation and Mixing of Liquids," Unit Operations of Chemical Engineering, McCabe and Thiele, Wiley Press.

Wet Chemical Wafer Cleaning, Lecture notes of Werner Kern, Semiconductor Wafer Cleaning Technology (2–day course), Sep. 23–24, 1991.

*Primary Examiner*—William Powell
*Attorney, Agent, or Firm*—Fliesler, Dubb, Meyer & Lovejoy LLP

[57] ABSTRACT

A liquid etch apparatus including an outer tank for holding a liquid etch solution, which has included therein an inner cylindrical member positioned in the outer tank. At one end of the inner cylindrical member, a sparger or other gas supply means may be provided. Filters are provided between the inner cylindrical member and the outer tank. Substrates are secured in the inner tank and a propeller is provided below the substrates. Gas is introduced into the inner cylindrical member during the etch process which creates a pressure gradient between the inner tank and the outer tank, forcing particulate matter carried by the gaseous particles to circulate around to the filters.

22 Claims, 2 Drawing Sheets

GAS AGITATED LIQUID ETCHER

BACKGROUND OF THE INVENTION

1. Field of the Invention

The invention relates to wet etching methods and apparatus.

2. Description of the Related Art

In manufacturing semiconductor integrated circuits, etch processes are used to remove select portions of layers of films formed on the surface of a semiconductor substrate. Generally, the etching step is a part of the photolithography progress where the goal is an exact transfer of a patterned image onto the layer of film material. There are two general types of etch processes: wet etching and dry etching. Wet etching involves placing the wafers into an etch-resistant boat and immersing the wafers in a tank of etchant material. After a predetermined time in the etch tank, they are processed through rinsing and drying steps. Heaters, agitation devices, and other techniques are used to enhance the uniformity and process control of the wet etch process. Dry etching techniques involve gasses as the primary etch medium, and the wafers are etched without wet chemicals or rinsing, thereby entering and exiting the etch chamber in a "dry" state.

In wet etch systems, etching uniformity and contamination of the wafers are key concerns. Filters may be used to filter clean the chemicals just prior to filling the immersion tank. Agitators have been used to circulate the etch material about the wafers once they are in the tank. However, neither of these solutions has provided complete freedom from contamination.

Etching processes for passivation and metal films in particular generate a great deal of residual particulate matter which may attach to the wafer surface. In such cases, fluid control characteristics play an important role in addition to the chemical action of the etchant on the films. In such a microscopic environment, the chemically etched species and the products formed thereby must be physically removed from the surface in the vicinity of the wafer. Adhesive forces which hold the residual particles through the surface of the wafer can be overcome by mechanical agitation.

Such agitation generally depends upon manual shaking of the wafer boats yielding a high degree of variation in the efficiency of the agitation process. A further important and more significant aspect of the operation is the separation of the removed chips from the wafer surface and the bulk etch solution to prevent resettling and attachment of the particulate to the wafer surface.

What is required is a suitable and uniform agitation means in a wet etch device which allows for greater consistency in the etch process.

SUMMARY OF THE INVENTION

The invention comprises a liquid etch apparatus which allows for improved uniformity in the liquid etching process and improved removal of particulate matter. In one aspect, the invention comprises a liquid etch apparatus including an outer tank for holding a liquid etch solution, which has included therein an inner cylindrical member positioned in the outer tank. At one end of the inner cylindrical member, a sparger or other gas supply means may be provided. Filters are provided between the inner cylindrical member and the outer tank. Substrates are secured in the inner tank and a propeller is provided below the substrates. Gas is introduced into the inner cylindrical member during the etch process which creates a pressure gradient between the inner tank and the outer tank, forcing particulate matter carried by the gaseous particles to circulate around to the filters, thereby improving agitation at the substrate surface and removing particulate matter from the etch environment.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

The present invention comprises a liquid etch apparatus and a method of etching films on a silicon substrate using a gas agitation of the etchant material in extreme close proximity to the wafer surface and an efficient mechanism for circulating the etchant liquid about the wafers and through filters. Such agitation provides for a more uniform and consistent etch process, and allows for the physical removal of particulate matter at the wafer surface.

Figure 1:
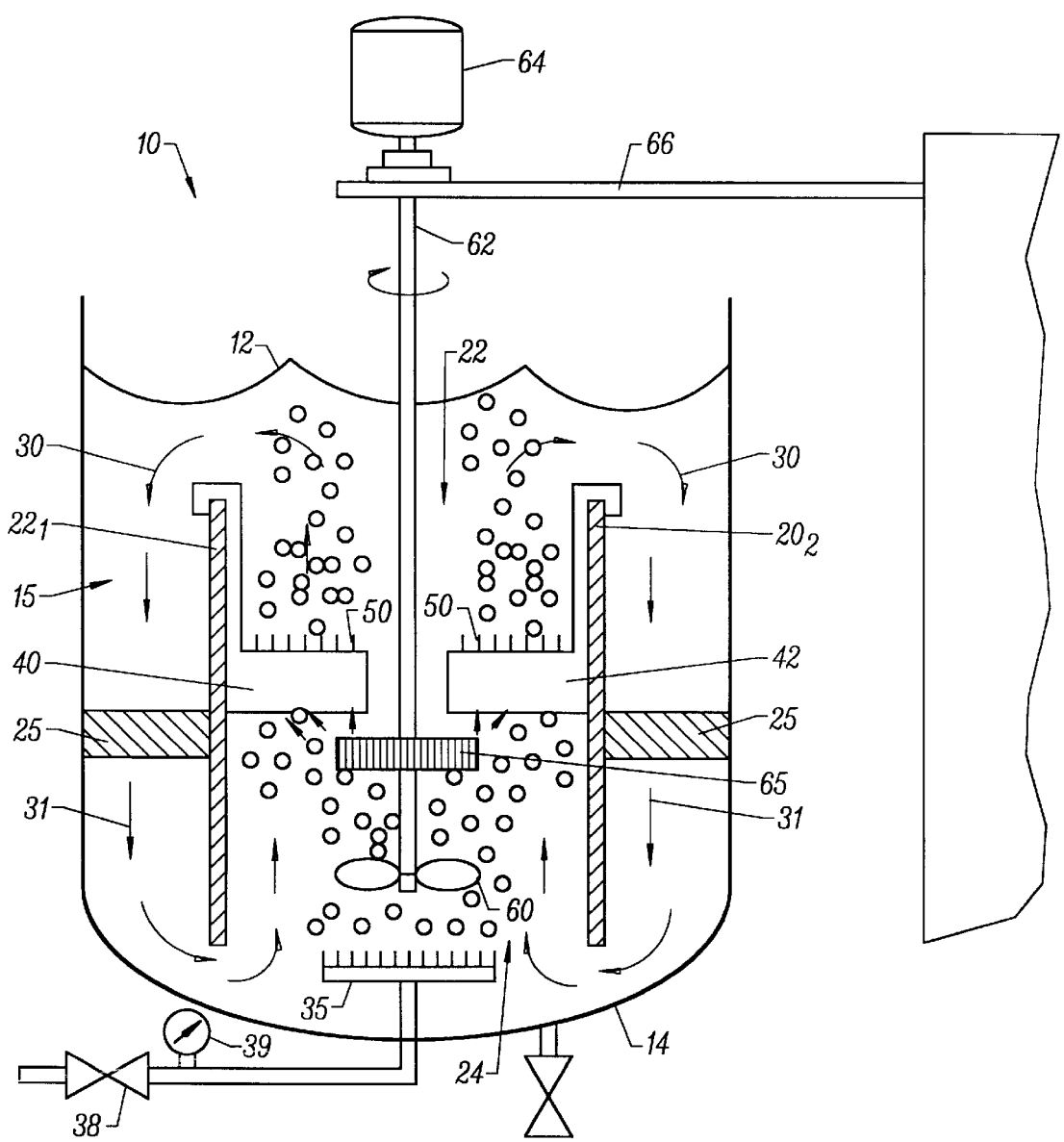
FIG. 1 is a cross-sectional view of a gas agitated liquid etcher in a first embodiment of the present invention.

FIG. 1 shows a cross-section of an exemplary wet etch apparatus in accordance with the present invention. Wet etch apparatus 10 includes a main reaction vessel 14 which is fitted with an interior concentric cylinder 20. A wet etchant liquid 12 is provided in the chamber during etch processing. The interior concentric cylinder 20 includes an open top portion 22 and open bottom portion 24 which allows for axial flow of liquid 12 along the direction of arrows such as arrows 30 and 31 shown in FIG. 1.

A sparger 35 is located at the bottom of the main reaction vessel 14 and inner concentric cylinder 20. Sparger 35 is coupled to a gas inlet line 39 which includes flow control valve 38 and flow rate meter 39. The gas inlet line 37 can be utilized to introduce any number of different agitation gasses into the chamber; in one embodiment, nitrogen is used.

Wafers 50 are provided in wafer holders 40,42 which, as shown in FIG. 1, are mounted on the inner concentric cylinder 20. The particular mounting arrangement of the wafer holders and wafers is not critical to the nature of the invention, so long as the wafers are mounted in the interior portion of concentric cylinder 20.

A propeller 60 is provided in the lower portion 24 of the inner concentric cylinder 20 on a shaft 62. Shaft 62 is coupled to a motor 64 which is itself provided on a mounting structure 66. A turbine blade 65 is provided on shaft 62.

Filters 25 are provided in the annular compartment 15 between the sides of the main reaction vessel 14 and the inner concentric cylinder 20. These filters are microporous filters with a pore size of 1 micron or less.

In operation, the liquid etchant material is provided into the reaction vessel 14 and the wafers 50 are lowered on wafer holders 40,42 into the inner concentric cylinder 20. A gas is introduced at the bottom 24 of inner compartment 20 through sparger 35. Departure of the incoming gas can be adjusted using the flow valve 38 to control the fraction of the bubbles in the inner compartment. Propeller 60 is generally used at low power to impart an upward flow to the etchant liquid. Bubbles will move upward by natural motion. A turbine 65 having a plurality of blades disperses the bubble movement from the center towards the walls of the inner cylinder and across the substrates 50 in wafer holders 40,42. The bubbles will move along the surface of the wafer, thereby removing any of the attached particles on the surface and improving etch uniformity by agitating the etchant liquid adjacent to the wafer surface. This is due to the fact that high shear forces and large turbulence exists at the gas/liquid interface at the bubble surface. These forces are primarily responsible for moving the particles. Particles removed at the wafer surface will move upward toward top portion 22 of inner concentric cylinder 20 and in a direction along arrows 30 to the annular compartment 15. The liquid flow carries these particles downward toward filters 25, thus separating them from the liquid 15 and wafers 50. The filters 25 will remove the particulate from the etchant liquid 12 and the etchant liquid will be recirculated along lines 31 back toward the interior of the inner concentric cylinder 20. It is possible that some particles will have an affinity for the gas liquid interface and may accumulate at the interface and be carried by the bubbles to the top of the inner compartment and into the outer annular portion.

Natural movement of the liquid from the annular outer compartment 15 to the interior of interior concentric cylinder 20 is achieved due to the difference in density between the fluids in the two compartments: fluid in the interior of inner cylinder 20 contains bubbles and hence has a lower density than the pure etchant liquid 12 in the annular outer compartment 15. The difference in densities between the interior of inner chamber 20 creates a pressure gradient which causes liquid movement from the annular chamber 15 to the interior of the inner cylinder 20. Propeller 60 is necessary to overcome the liquid pressure drop across the filters in the outer annular compartment. Turbine 65 serves to disperse the bubbles and prevent channeling of bubbles in the inner compartment. Channeling can result in non-uniform film removal from the surface of the wafers.

Figure 2:
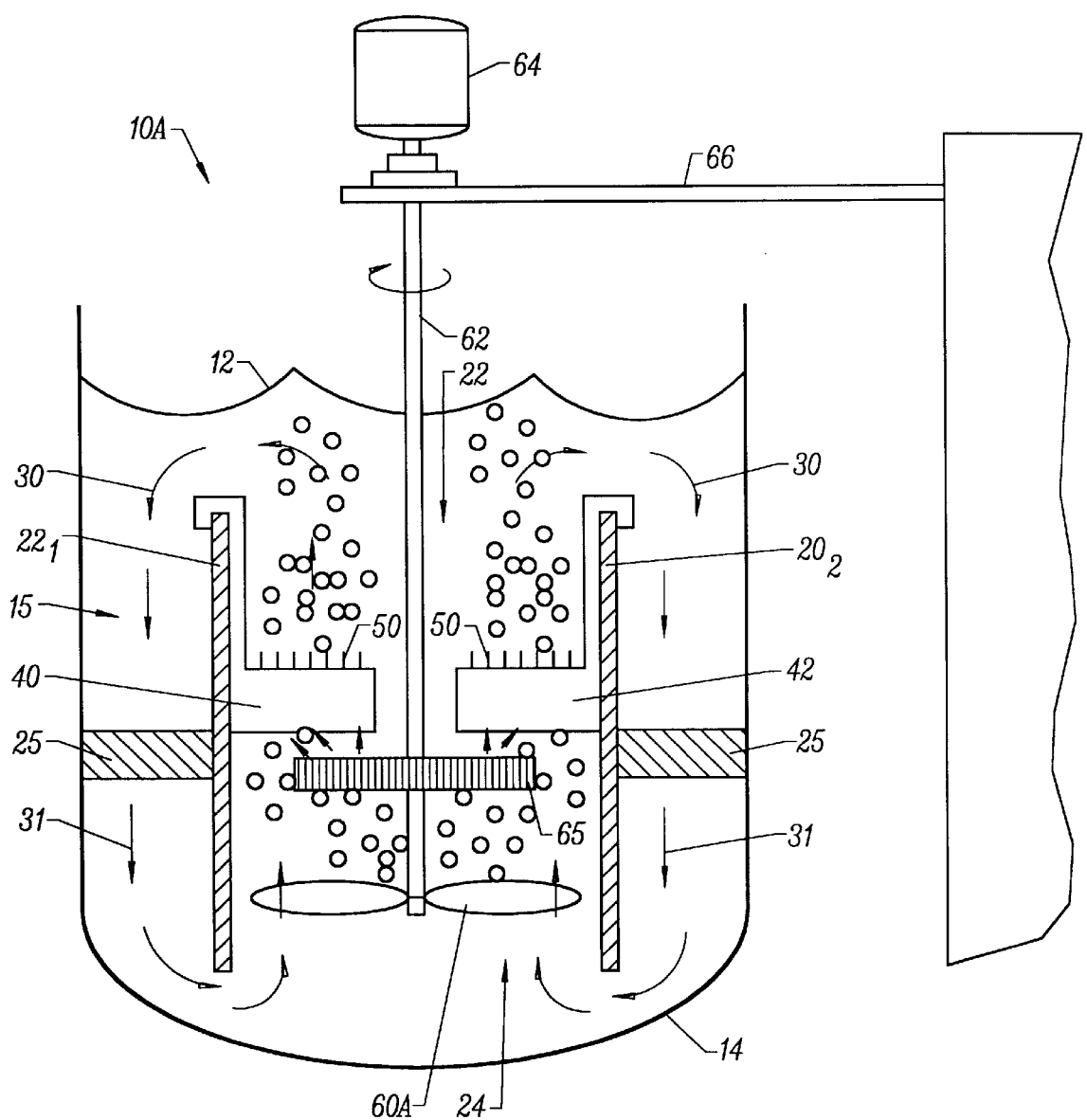
FIG. 2 is a cross-section of a gas agitated liquid etcher in accordance with a second embodiment of the present invention.

FIG. 2 shows an alternative embodiment of the present invention wherein a gas inducing propeller 60*a* is utilized. The gas inducing propeller eliminates the need for the gas inlet line, but can utilize the air above the liquid level directly for generating bubbles. The purity of the gas used for generating bubbles in the embodiment shown in FIG. 2 will generally be a limiting condition. In yet another variation, the turbine 65 may be eliminated.

It should be recognized that further additional refinements can be made and used to control etching the present invention. In particular, the success of the etch characteristics will be dependent on the pressure at the gas inlet, viscosity of the etchant liquid 12, and speed of agitation. Each of these factors may be empirically addressed to determine the most optimal etch characteristics for the particular process application. The particular etchant liquid 12 is not critical to the nature of the invention. It will be understood that, in general, particulate contamination is more acute in aluminum etching processes wherein phosphoric acids are used in conjunction with nitric acids, acidic acids, water, and wetting agents. In general, silicon dioxide requires etchants of hydrofluoric acid in combination with ammonium fluoride. In each case, the viscosity of the etch material may be chemically altered (in conjunction with the gas pressure and agitation speed) to provide optimal etch characteristics for the particular process. Still further, a reactive gas may be utilized to remove particulate in the film, or an inert gas may be utilized, in accordance with the present invention.

The method and apparatus of the present invention allows for formation of silicon devices in a much more consistent manner than that known in the prior art. Manual agitation need not be used to ensure uniform etching of the wafers.

The many features and advantages of the present invention will be apparent to one of average skill in the art. All such features and advantages of the present invention are intended to be within the scope of the invention as defined herein. As such, the foregoing description is illustrative and not exhaustive, and the scope of the present invention is defined by this specification and the attached claims.

What is claimed is:

1. An etch chamber, comprising:
   an outer chamber having an open top portion and a bottom portion suitable for holding a liquid etchant;
   an inner cylindrical member having an open top end and an open bottom end in the outer chamber; and
   a gas inlet fixture positioned at the bottom portion of the outer chamber, the gas inlet fixture providing a gas in the inner cylindrical member forming a first pressure region in the liquid etchant in the inner cylindrical member and a second, higher pressure region in the outer chamber.

2. The etch chamber of claim 1 further including a propeller positioned at the bottom end of the inner cylindrical member.

3. The etch chamber of claim 1 further including a filter positioned between the inner cylindrical member and the outer chamber.

4. The etch chamber of claim 1 wherein a pressure gradient is created between the inner cylindrical member and the outer chamber when gas is inserted through the gas inlet fixture.

5. The etch chamber of claim 1 wherein the gas inlet fixture comprises a sparger.

6. The etch chamber of claim 5 wherein the sparger is coupled to a gas flow line, and a flow control valve and flow meter are coupled to the gas flow line.

7. The etch chamber of claim 1 wherein the etch chamber further includes a propeller provided in the bottom portion of the outer chamber, the propeller being mounted on a shaft, and further including a turbine mounted on the shaft.

8. The etch chamber of claim 7 wherein silicon substrates are provided on a wafer holder in an interior portion of the inner cylindrical member.

9. The etch chamber of claim 8 wherein a turbine blade is provided below the wafer holders, and the propeller is provided below the turbine.

10. The etch chamber of claim 1 wherein the gas inlet fixture comprises a propeller having a plurality of openings for distributing the gas and overcoming pressure drop through the filters.

11. An etch apparatus, comprising:
    an etch chamber, including an outer tank and an inner cylindrical member, the inner cylindrical member having a top portion and a bottom portion;
    a liquid etchant material in the chamber; and
    a gas, in the etch chamber, for forming a first low pressure region adjacent to the substrates in the inner cylindrical member, and a second high pressure region in a second region of the liquid etchant.

12. The apparatus of claim 11 wherein the substrates are provided in the inner cylindrical member.

13. The apparatus of claim 11 further including a propeller, positioned in the etch chamber, and a turbine, positioned just below the wafer substrates for disseminating the gas and improving etch uniformity.

14. The etchant apparatus of claim 11 further including a sparger positioned below the inner cylindrical member, a propeller positioned above the sparger, and a filter between the inner cylindrical member and the etch chamber.

15. A gas agitated liquid etch device, comprising:

an outer tank suitable for holding a liquid etchant solution therein;

an inner cylindrical member positioned in the outer tank;

a sparger in the outer tank coupled to a gas supply for introducing an agitation gas into the etch device, the agitation gas producing a first pressure region in the liquid within the inner cylindrical member, and a second, higher pressure region in the outer tank; and a wafer holder in the inner cylindrical member.

16. The liquid etch device of claim 15 wherein filters are provided between the inner tank and the inner cylindrical member.

17. The liquid etch device of claim 15 wherein the device further includes a propeller positioned at one end of the inner cylindrical member.

18. The liquid etch device of claim 15 wherein the device further includes a turbine blade.

19. A liquid etch apparatus, comprising:

a main reaction vessel;

an inner reaction vessel comprising a concentric cylinder within the reaction vessel, the concentric cylinder having an open top portion and an open bottom portion;

a liquid etchant material in the reaction vessel;

a wafer holder positioned in the inner reaction vessel;

a filter positioned between the inner reaction vessel and the main reaction vessel;

a gas supply;

a sparger in the main reaction vessel coupled to the gas supply;

a propeller positioned adjacent to the bottom portion of the inner reaction vessel; and a turbine blade positioned in the inner reaction vessel.

20. An etch apparatus, comprising:

an etch chamber;

means for etching material in the etch chamber;

gaseous means for agitating the means for etching at the material in the etch chamber;

means for circulating the means for etching in the etch chamber; and means for filtering the etchant material to keep the active area particulate-free.

21. A semiconductor device including a film wherein said film is removed by a liquid etch process comprising:

providing a liquid etch material;

placing the substrate in the liquid etch material; and agitating the liquid etchant about the substrate by inserting a gas and generating uniform high velocity gas bubbles into the liquid etch material thereby circulating the liquid etch material by forming a low pressure region adjacent to the substrate, and a second, higher pressure region away from the substrates.

22. The device of claim 21 further including the step of:

continuously filtering the etchant liquid to remove film particulates and etched species, and regenerating a clean etchant solution.

* * * * *